(12) United States Patent
Ray et al.

(10) Patent No.: US 7,217,502 B2
(45) Date of Patent: May 15, 2007

(54) NANOPASTES FOR USE AS PATTERNING COMPOSITIONS

(75) Inventors: Kevin B. Ray, Fort Collins, CO (US); Jianbing Huang, Trumbull, CT (US); Heidi M. Munnelly, Windsor, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/444,740

(22) Filed: Jun. 1, 2006

(65) Prior Publication Data

US 2006/0216648 A1 Sep. 28, 2006

Related U.S. Application Data

(63) Continuation-in-part of application No. 10/400,715, filed on Mar. 27, 2003, now Pat. No. 7,094,503.

(51) Int. Cl.
*G03C 5/00* (2006.01)
(52) U.S. Cl. .................................. 430/302; 430/331
(58) Field of Classification Search ................ 430/302, 430/331
See application file for complete search history.

(56) References Cited

U.S. PATENT DOCUMENTS

| 5,698,360 A | 12/1997 | Timpe |
| 5,700,619 A | 12/1997 | Baumann et al. |
| 5,738,013 A | 4/1998 | Kellett |
| 5,925,491 A | 7/1999 | Baumann et al. |
| 6,341,560 B1 | 1/2002 | Shah et al. |
| 6,359,056 B1 | 3/2002 | Aurenty et al. |
| 6,432,526 B1 | 8/2002 | Arney et al. |
| 6,582,882 B2 | 6/2003 | Pappas et al. |
| 6,899,994 B2 | 5/2005 | Huang et al. |
| 2004/0191641 A1 | 9/2004 | Ray et al. |
| 2004/0191695 A1 | 9/2004 | Ray et al. |

FOREIGN PATENT DOCUMENTS

| EP | 1 120 247 | 8/2001 |
| EP | 1 157 825 | 11/2001 |
| EP | 1 157 826 | 11/2001 |
| EP | 1 157 827 | 11/2001 |
| EP | 1 157 828 | 11/2001 |
| EP | 1 211 063 | 6/2002 |
| WO | WO 95/23244 | 8/1995 |
| WO | WO 00/37254 | 6/2000 |
| WO | WO01/11426 | 2/2001 |
| WO | WO 01/54915 | 8/2001 |
| WO | WO 02/47447 | 6/2002 |

*Primary Examiner*—Christopher G. Young
(74) *Attorney, Agent, or Firm*—J. Lanny Tucker

(57) ABSTRACT

The present invention provides methods of imagewise exposing a thermally sensitive composition formed from a nanopaste comprising inorganic nanoparticles, a carrier, and preferably certain polymeric binders. The composition has been applied to a substrate and treated to improve adhesion. Exposure affects the solubility of exposed portions of the applied and treated layer relative to unexposed portions of the applied layer. The imaged layer is then developed on-press with a fountain solution, lithographic ink, or both, to remove the exposed portions or unexposed portions of the layer to form an image in a printing plate.

20 Claims, No Drawings

NANOPASTES FOR USE AS PATTERNING COMPOSITIONS

CROSS-REFERENCE TO RELATED APPLICATIONS

This is a continuation-in-part of recently allowed and commonly assigned application Ser. No. 10/400,715, filed Mar. 27, 2003 now U.S. Pat. No. 7,094,503 by Kevin Ray et al.

BACKGROUND OF THE INVENTION

The art of lithographic printing is based on the immiscibility of ink and water. A lithographic printing plate is composed of ink receptive regions, commonly referred to as the "image area," generated on a hydrophilic surface of a substrate. When the surface of the printing plate is moistened with water and printing ink is applied, revealed portions of the hydrophilic surface retain the water and repel the printing ink, and the oleophilic image area accepts the printing ink and repels the water. The printing ink retained on the oleophilic image area may then be transferred to the surface of a material upon which the image is to be reproduced. Typically, the ink is first transferred to an intermediate blanket, which in turn transfers the ink to the desired surface.

Lithographic printing plates typically comprise a radiation-sensitive coating applied over the hydrophilic surface of a substrate. Conventional radiation-sensitive coatings include photosensitive components dispersed within an organic polymeric binder. After a portion of the coating is exposed to radiation (commonly referred to as imagewise exposure), the exposed portion becomes either more soluble or less soluble in a developer than an unexposed portion of the coating. A printing plate is generally considered a positive-working plate if, after exposure to radiation, the exposed regions or areas of the radiation-sensitive coating become more soluble and are removed in the developing process to reveal the hydrophilic surface. Conversely, if the exposed regions or areas become less soluble in the developer and the unexposed regions or areas are removed in the developing process, the plate is considered a negative-working plate. In each instance, the undeveloped areas that remain on the plate provide an ink-receptive image, while the revealed regions of the substrate's hydrophilic surface repel ink.

High demands are placed on radiation-sensitive coatings used for printing plates. Heretofore, two avenues have been taken to improve the properties of these coatings. The first avenue concentrates on improving the properties of the photosensitive components of the coatings. The second avenue involves improving the properties of the polymeric binder that controls the physical and mechanical properties of the coating. The latter avenue has been the source of significant research and innovation because the behavior of radiation-sensitive coatings in the imaging, developing and printing processes, as well as the shelf life and durability of the printing plate are heavily influenced by the choice of binder material.

These polymeric binders include various substituents having differing effects on the physical and mechanical properties of the binder. For example, hydrophilic structural elements such as carboxyl groups, hydroxyl groups, etc., generally promote good developability of the photosensitive compositions in aqueous-alkaline developers and contribute to adequate adhesion to traditional substrates. On the other hand, hydrophobic structural elements hinder the developability in common developers, but ensure good acceptance of the ink in the printing process, which is absolutely essential for printing plates.

Given the broad spectrum of requirements for polymer binders, there has been much work on the synthesis and optimization of the use of these binders for photosensitive compositions, see for example, H. Baumann and H. J. Timpe, Chemical Aspects of Offset Printing, *J prakt. Chem./Chemiker-Zeitung*, Vol. 336, pgs. 377–89 (1994). Below is a summary of numerous types of previously reported polymer binders. As noted, each of these binder types suffer from some drawback resulting from the need to balance the broad spectrum of desired properties required for printing plates, including adherence to the substrate, durability, photosensitivity, developability, and ink-receptiveness.

U.S. Pat. Nos. 4,511,640, 4,618,562, and 4,731,316 describe binder systems that are composed of mixtures of various polymers, possessing different hydrophilic/hydrophobic properties. These mixtures have drawbacks in that separation of the mixture often occurs during the coating process. Furthermore, separation of the hydrophobic polymers in the development step may result in silting in the development machines and redeposition of dispersed elements of the coating on the surface of the photosensitive material.

Moreover, various copolymers containing monomer units having low hydrophilic properties, such as styrene, acrylate, methacrylate, etc., combined with more hydrophilic comonomers have been reported. Examples of such comonomers are semi-esters of maleic acid (Canadian Patent 1,172,492 and U.S. Pat. No. 4,687,727), itaconic acid (U.S. Pat. No. 5,260,161), and acrylic acid or methacrylic acid (EP 487 343A1 and U.S. Pat. Nos. 4,304,832 and 4,123,276). The drawback of such copolymers is the potentially narrow margin of applicability for properties such as film adhesion, developability, ink acceptance, and plate life.

U.S. Pat. No. 4,177,073 describes a photosensitive composition in which the binder is a reaction product of cellulose esters with cyclical, intramolecular acid anhydrides of dicarboxylic acids. However, these binders may not be sufficiently oleophilic for use in printing plate formulations. Furthermore, their printing plate life may not meet the demands of a modern printing plate.

Acetals of aliphatic aldehydes with unsubstituted lower alkyl group and vinyl alcohol/vinyl acetate copolymers have been reported (U.S. Pat. Nos. 2,179,051 and 4,665,124). But such binders may cause problems during the development of printing plates due to an insufficient proportion of hydrophilic groups in the polymer. As an improvement, partially acetalized vinyl alcohol/vinyl acetate copolymers have been provided with hydrophilic or alkaline-soluble groups by additional reactions. U.S. Pat. No. 4,940,646 reports aldehyde-containing hydroxyl groups that are used for the acetalization, besides aldehydes with hydrophobic groups (e.g., alkyl or aryl groups). Yet this structural change may not result in a distinct improvement in developability.

In order to improve developability, sulfonyl urethane groups were introduced into polyvinyl acetals as reported in U.S. Pat. Nos. 3,372,105, 3,732,106, and 4,387,151. However, the low acidity of these groups requires developers with a large amount of solvent. Furthermore, the microelements of the resulting printing plate may have poor adhesion and may be easily abraded in the printing process.

GB 1,396,355 and U.S. Pat. No. 3,847,614 describe binders that may be produced by acetalization of saponified copolymers of vinyl acetate and a carboxyl group-carrying monomer, such as crotonic acid. However, this type of binder may result in systems with poor photosensitivity and short printing plate life. Moreover, such compositions may be poorly developable in aqueous-alkaline developers, because the acid number of the binder is greatly decreased by chemical reactions of the carboxyl group during the saponification and/or acetalization process.

U.S. Pat. Nos. 5,045,429 and 4,681,245 describe compositions including carboxyl groups formed by reacting acetals, which have been separately produced from aliphatic aldehydes and polyvinyl alcohol, with intramolecular cyclical acid anhydrides of dicarboxylic acids. However, the synthesis may be costly because the reaction of the acid anhydrides is only possible in aprotic solvents. Furthermore, the photosensitivity of the compositions prepared from this type of binder may be too low.

U.S. Pat. No. 4,741,985 describes binders produced in a three-stage synthesis, starting with polyvinyl alcohol. The first stage is acetalization with aliphatic aldehydes. The second stage is reaction with intramolecular cyclical acid anhydrides of dicarboxylic acids. The third stage is partial esterification of the carboxyl groups with substituted alkyl halides. Despite the high expense in the synthesis of this binder material, the photosensitivity of the resulting film may be inadequate.

The expense of a multi-stage synthesis may be avoided if, as described in U.S. Pat. Nos. 5,219,699, 4,652,604, 4,895,788, 4,940,646 and 5,169,897, polyvinyl alcohol is reacted with aliphatic aldehydes and carboxyl-containing aliphatic or carboxyl-containing aromatic aldehydes. However, the photosensitive compositions prepared from this may not be suitably radiation-sensitive or developable.

Mixtures of polyvinyl acetals and organic polymers, which possess an acid number greater than 71 mg KOH/g, have also been described in U.S. Pat. No. 5,143,813. However, separation of the mixture from the substrate can occur during lamination or drying of the photosensitive compositions.

Thus, despite the significant amount of effort spent developing improved organic polymeric binders, reported binders tend to suffer from one or more drawbacks. As noted above, certain types of polymeric binders lack suitable adherence to substrates. Other polymeric binders lack suitable photosensitivity under conventional imaging conditions. Still other polymer binders have difficulty withstanding the extended exposure/development steps required in the production of certain printing plates, for example, flexographic printing plates. Further certain polymer binders have barely sufficient developer resistance after imaging, particularly IR imaging. Further yet, certain polymer binders have low resistance to the mechanical stress that plates are subjected to, as well as the chemicals used to clean and treat finished plates. Additionally, many of the polymer binders must be dissolved in organic solvents during manufacturing of the printing plate. Many organic solvents are being subjected to increased regulation due to environmental considerations.

SUMMARY OF THE INVENTION

The present invention provides a method for forming an image comprising:
imagewise exposing a thermally sensitive composition formed from a nanopaste comprising inorganic nanoparticles and a carrier, which composition has been applied and treated as a layer to provide adhesion to a substrate, to affect the solubility of exposed portions of the applied and treated layer relative to unexposed portions of the applied layer; and
developing the applied layer on-press with a fountain solution, lithographic ink, or both, to remove the exposed portions or unexposed portions of the layer to form an image.

The present invention also provides a method of forming an image on a substrate, in which a thermally sensitive composition including a nanopaste is applied onto a surface of a substrate. The layer may then be treated to form a solid layer that adheres to the surface of the substrate. The layer is then imagewise exposed to radiation to affect the solubility of exposed portions or areas of the layer relative to unexposed portions or areas of the layer. The imaged layer is then developed on-press to remove either the exposed portions or unexposed portions of the layer to form an image. This process may be particularly useful in the formation of image areas (that is, an image) on lithographic printing plates. The method can also be used to both image and develop the nanopaste-containing layer on-press. The resulting element can be either negative-working or positive-working.

In other embodiments, the method of this invention for forming an image comprises:
imagewise exposing a thermally sensitive composition that has been applied as a layer to a substrate and has been treated to provide adhesion to the substrate, to affect the solubility of exposed portions of the applied layer relative to unexposed portions of the applied layer; and
developing the applied layer on-press with a fountain solution, lithographic ink, or both to remove the exposed portions or unexposed portions of the layer to form an image,
wherein the thermally sensitive composition comprises a nanopaste that comprises inorganic nanoparticles and a carrier.

Still again, a method for forming an image comprises:
applying onto a surface of a substrate, a thermally sensitive composition comprising a nanopaste that comprises inorganic nanoparticles and a carrier;
treating the thermally sensitive composition to form a solid layer that adheres to the surface of the substrate;
imagewise exposing the layer on-press to radiation to affect the solubility of exposed portions of the layer relative to unexposed portions of the layer; and
developing the layer on-press to remove the exposed portions or unexposed portions of the layer to form an image.

As used herein, the term "nanopaste" refers to a mixture or sol composed of inorganic nanoparticles dispersed in a carrier. Suitable carriers depend on the specific composition and the desired application, but generally include, organic carriers, aqueous carriers and mixtures of organic and aqueous liquids. In certain embodiments, the nanopaste is an inorganic nanopaste including inorganic nanoparticles in a substantially aqueous carrier. In these embodiments, the carrier may be composed of water or mixtures of water with water-miscible organic solvents such as suitable alcohols.

The inorganic nanoparticles may form a stable dispersion in the carrier at room temperature. Furthermore, the inorganic nanoparticles are of such a size that the viscosity of the dispersion is surprisingly low. This property, in part, allows for a high concentration of inorganic nanoparticles to be included in the nanopaste without adversely affecting the application of the nanopaste to a substrate. In one embodiment, the inorganic nanoparticles compose between about 0.5 and about 75 w/w % of the nanopaste.

The nanopaste may optionally include additional components, such as dispersing agents, binders, surfactants, humectants, biocides, viscosity builders, colorants, pH adjusters, drying agents, defoamers or combinations thereof.

In a further embodiment, the present invention provides a method of making a printing plate precursor, in which a thermally sensitive composition including a nanopaste applied onto a surface of a substrate. The thermally sensitive composition is then treated by air or oven drying to form a layer that adheres to the substrate. The resulting layer may then be imagewise exposed to radiation to affect the solubility of exposed portions of the layer relative to unexposed portions of the layer. The imaged layer may then be developed on-press to remove either the exposed or unexposed portions of the layer to form an image area. The resulting image area may then be immersed in a suitable conditioner to enhance the ink-receptive properties of the image area.

The thermally sensitive composition has several characteristics making it particularly suitable for use in printing plates. First, the inorganic nanoparticles may be dispersed in substantially aqueous carriers and do not necessarily need to be soluble or dispersible in substantially organic carriers. Additionally, the inorganic nanoparticles are sized such that application of the composition to a substrate may be performed by conventional methods. Further, the nanopaste adheres well to a variety of substrates. Further yet, the nanopaste has suitable photosensitivity and solubility in suitable developers to form high quality image areas. Also, the inorganic nanopaste may form a durable image with a long life. The inorganic nanopaste also has suitable optical density and may also be treated to enhance the ink receptiveness of the image for use in printing plates.

DETAILED DESCRIPTION

The present invention provides methods of forming image areas on a substrate for a variety of applications, including lithographic printing plates and masks. In one embodiment, an image area is formed on a substrate by applying a thermally sensitive composition composed of a nanopaste onto the substrate and then treating the thermally sensitive composition (e.g., air or oven drying) to form a layer. The layer is then imaged and developed on-press to form an image area.

Suitable substrates for the present invention may vary widely depending upon the desired application and the specific composition employed. Suitable substrates or substrate surfaces may be hydrophilic or oleophilic, and may be composed of metals, polymers, ceramics, stiff papers, or laminates or composites of these materials. Suitable metal supports include aluminum, zinc, titanium and alloys thereof. In one embodiment, the substrate includes aluminum, which may be treated by graining and anodizing and may then be conditioned to produce a hydrophilic surface. Suitable polymeric supports include polyethylene terephthalate films, polyester, and epoxy laminates. Such polymeric supports may be coated with hydrophilicity-enhancing components, including alkoxysilanes, aminopropyltriethoxysilane, glycidoxypropyltriethoxysilane and epoxy functional polymers, as well as conventional coating materials used on polyester bases in photographic films. The substrate may be of sufficient thickness to sustain the wear from printing or other desired applications, and thin enough to wrap around a printing form, typically from about 100 to about 600 μm.

Specific examples of suitable substrates and substrate treatments are provided in Table 1 below:

TABLE 1

| SUBSTRATE | SURFACE TREATMENT | INTERLAYER TREATMENT |
|---|---|---|
| AA | Quartz Grained and Anodized | None |
| EG-PVPA | Electrograined and Anodized | Polyvinyl phosphoric acid |
| PF | Electrograined and Anodized | Sodium dihydrogen phosphate/Sodium fluoride |
| G20 | Electrograined and Anodized | Vinylphosphonic acid/acrylamide copolymer |
| EG-Sil | Electrograined and Anodized | Sodium Silicate |
| DS-Sil | Chemically Grained and Anodized | Sodium Silicate |
| PG-Sil | Pumice Grained and Anodized | Sodium Silicate |
| CHB-Sil | Chemically Grained, Anodized and Silicated | Sodium Silicate |

In Table 1 above, the abbreviation "AA" refers to "as anodized." An aluminum surface is quartz grained and then anodized using DC current of about 8 A/cm$^2$ for 30 seconds in a $H_2SO_4$ solution (280 g/liter) at 30° C.

"EG" means "electrolytic graining." The aluminum surface is first degreased, etched and subjected to a de-smut step (removal of reaction products of aluminum and the etchant). The plate is then electrolytically grained using an AC current of 30–60 A/cm in a HCl solution (10 g/liter) for 30 seconds at 25° C., followed by a post-etching alkaline wash and a de-smut step. The grained plate is then anodized using DC current of about 8 A/cm$^2$ for 30 seconds in a $H_2SO_4$ solution (280 g/liter) at 30° C.

"PVPA" is a polyvinylphosphonic acid. A plate is immersed in a PVPA solution and then washed with deionized water and dried at room temperature.

"PF" means that the substrate has a phosphate fluoride interlayer. The process solution contains sodium dihydrogen phosphate and sodium fluoride. An anodized substrate is treated in the solution at 70° C. for a dwell time of 60 seconds, followed by a water rinse and drying. The sodium dihydrogen phosphate and sodium fluoride are deposited as a layer to provide a surface coverage of about 500 mg/m$^2$.

"G20" is a printing plate substrate described in U.S. Pat. No. 5,368,974 that is incorporated herein by reference.

"Sil" means that an anodized plate is immersed in a sodium silicate solution to coat it with an interlayer. The coated plate is then rinsed with deionized water and dried at room temperature.

"DS" means "double sided smooth." As aluminum oxide plate is degreased, etched or chemically grained, and subjected to a de-smut step. The smooth plate is then anodized.

"PG" means "pumice grained." The surface of an aluminum substrate is degreased, etched and subjected to a de-smut step. The plate is then mechanically grained by subjecting it to a 30% pumice slurry at 30° C., followed by a post-etching step and de-smut step. The grained plate is then anodized using DC current of about 8 A/cm$^2$ for 30 seconds in a $H_2SO_4$ solution (280 g/liter) at 30° C. The anodized plate is then coated with an interlayer of, for example, sodium silicate.

"CHB" means chemical graining in a basic solution. After an aluminum substrate is subjected to a matte finishing process, a solution of 50 to 100 g/liter NaOH is used during graining at from about 50° C. to about 70° C. for 1 minute.

The grained plate is then anodized using DC current of about 8 A/cm² for 30 seconds in a H₂SO₄ solution (280 g/liter) at 30° C. The anodized plate is then coated with a silicated interlayer.

The nanopaste useful in the present invention comprises at least inorganic nanoparticles and a carrier. Examples of suitable inorganic nanoparticles include metal nanoparticles composed of silver, palladium, gold, platinum, nickel, copper or mixtures or alloys of these materials. The inorganic nanoparticles are generally formed by gas evaporation or other known methods, and have an average diameter of less than 50 nm, more particularly less than 25 nm and even more particularly less than 15 nm. Mixtures of different inorganic nanoparticles can be present in the nanopaste.

Suitable carriers for use in the nanopaste of the present invention may include aqueous carriers, organic carriers and mixtures of aqueous and organic liquids. In one embodiment, the nanopaste is an inorganic nanopaste composed of inorganic nanoparticles in a substantially aqueous carrier. As used herein, the phrase "substantially aqueous carrier," refers to carriers containing greater than about 50 v/v % water. Examples of suitable substantially aqueous carriers include solutions of 100 v/v % water and mixtures of water and water-miscible organic liquids such as alcohols.

Specific examples of the nanopastes described herein include a silver/palladium sol having a metallic particle average diameter of 11.1 nm supplied in a 5 w/w % solution in water by ANP, Kumho-ri, Buyong-nyeon, Chungwon-Kun, Chungcheongbukdo, Korea. Another example is a silver sol having a metallic particle average diameter of 11.0 nm supplied in a 5 w/w % solution in water by ANP.

At room temperature, the nanopaste acts as a stable aqueous dispersion in a desired carrier. Due, in part, to the small size of the inorganic nanoparticles, a relatively large inorganic nanoparticle concentration may be used in the nanopaste while still maintaining a suitable viscosity for application onto a substrate. In one embodiment, the nanopaste may be composed of from about 0.5 to about 75 w/w % inorganic nanoparticles. In another embodiment, the nanopaste may be composed of from about 0.5 to about 25 w/w % inorganic nanoparticles. In yet another embodiment, the nanopaste may be composed of from about 0.5 to about 10 w/w % inorganic nanoparticles.

Optionally, the nanopaste may also include a surfactant or other suitable dispersing agent to promote a stable dispersion of the inorganic nanoparticles in the carrier and/or to improve the resolution of the image area. Examples of suitable dispersing agents include cationic, anionic, amphoteric and non-ionic surfactants. Specific examples include perfluoroalkyl, alkylphenyl, or polysiloxane surfactants. Suitable polysiloxane surfactants include polyether/polysiloxane copolymer, alkyl-aryl modified methyl-polysiloxane and acylated polysiloxane. Other suitable surfactants include sorbitan tristearate, sorbitan monopalmitate, sorbitan triolate, mono glyceride stearate, polyoxyethylene nonylphenyl ether, alkyl di (aminoethyl) glycine, alkyl polyaminoethylglycine hydrochloride, 2-alkyl-n-carboxyethyl-N-hydroxyethyl imidazolinium betaine, and N-tetradecyl-N,N-substituted betaine.

Additional surfactants include alkylated surfactants, fluorosurfactants and siliconated surfactants. Examples of these surfactants include sodium dodecylsulfate, isopropylamine salts of an alkylarylsulfonate, sodium dioctyl succinate, sodium methyl cocoyl taurate, dodecylbenzene sulfonate, alkyl ether phosphoric acid, N-dodecylamine, dicocoamine, 1-aminoethyl-2-alkylimidazoline, 1-hydroxyethyl-2-alkylimidazoline, cocoalkyl trimethyl quaternary ammonium chloride, polyethylene tricecyl ether phosphate and the like.

Examples of suitable fluorosurfactants also include ZONYL FSD, ZONYL FSA, ZONYL FSP, ZONYL FSJ, ZONYL FS-62, ZONYL FSK, ZONYL FSO, ZONYL FS-300, ZONYL FSN, and OLIN 10G, all of which are commercially available from E.I. DuPont De Nemours & Co. Additional examples of suitable fluorosurfactants include FLUORAD FC-135, FLUORAD FC-129, FLUORAD FC-120, FLUORAD FC-100, FLUORAD FC-170C FLOURAD FC431 and FLUORAD FC-171, all of which are commercially available from 3M, St. Paul, Minn.

Further examples of suitable surfactants include polyether modified polydimethyl-siloxane, silicone glycol, polyether modified dimethyl-polysiloxane copolymer, and polyetherpolyester modified hydroxy functional polydimethyl-siloxane.

Optionally, the thermally sensitive composition or nanopaste, may also include one or more polymeric binders that may affect the physical and mechanical properties of the thermally sensitive composition. Suitable polymeric binders may be soluble or dispersible in the carrier used in a particular nanopaste. Such polymeric binders may be suitably soluble in organic carriers, aqueous carriers and/or mixtures of organic and aqueous solutions.

Examples of suitable polymeric binders include epoxy resins, modified epoxy resins, polyester resins, novolak resins, cellulosic materials, hydroxypropylcellulose, hydroxyethylcellulose, hydroxypropylmethylcellulose, carboxymethylcellulose, copolymers of vinylidene chloride and acrylonitrile, acrylic acid resins, polyvinyl resins, silicone resins, polyamide resins, vinyl alcohol resins, resol resins, acetal resins, polyacrylonitrile resins, formaldehyde resins, polycarbonate resins, polyimide resins, polyethyleneimine, poly(ethyloxazoline), gelatin, starches, dextrin, amylogen, gum arabic, agar, algin, carrageenan, fucoidan, laminaran, corn hull gum, gum ghatti, karaya gum, locust bean gum, pectin, guar gum and copolymers or derivatives thereof.

Additional examples may include epoxy resins produced by the condensation of epichlorohydrin and Bisphenol A or F, epoxy novolak resins, rubber modified epoxy resins, Bisphenol A based polyester resins, epoxydized o-cresylic novolaks, urethane modified epoxy resins, phosphate modified Bisphenol A epoxy resins, cellulose esters, copolymers of vinylidene chloride and acrylonitrile, poly(meth)acrylates, polyvinyl chloride, silicone resins, polyesters containing hydroxy or carboxy groups, polyamides comprising amino groups or carboxy groups, polymers and copolymers of vinyl alcohol, polyvinylimidazole, polyvinylpyrrolidone, polymers and copolymers of vinylphenol, acrylamide, methylol acrylamide, methylol methacrylamide, polyacrylic acid, methacrylic acid, hydroxyethyl acrylate, hydroxyethyl methacrylate, maleic anhydride/vinyl methyl ether copolymers, novolak resin, resol resin, polyvinyl phenol resin, copolymers of acrylic acid, polyacetal, poly(methyl methacrylate), polymethacrylic acid, polyacrylonitrile, cellulose acetate, cellulose acetate butyrate, cellulose acetate propionate, melamine formaldehyde resins, polycarbonates, polyimides and urea formaldehyde resins.

Particularly useful polymeric binders in the nanopaste to facilitate on-press development include polymeric binders that are dispersible, developable, or soluble in water or water/solvent mixtures such as fountain solutions or in lithographic inks, or in mixtures of both. Such polymeric binders include polymeric emulsions, dispersions, or graft polymers having pendant poly(alkyleneoxide) side chains that can render the imageable elements as "on-press" developable. Such polymeric binders are described for example in U.S. Pat. No. 6,582,882 (Pappas et al.) and U.S. Pat. No. 6,899,994 (Huang et al.). In some instances, these polymeric binders are present in the imageable layer as discrete particles. Mixtures of such polymeric binders can be used if desired.

Other useful polymeric binders are described in copending and commonly assigned U.S. Ser. No. 11/196,124 (filed Aug. 3, 2005 by Saraiya et al.) and have hydrophobic backbones and comprise both of the following a) and b) recurring units, or the b) recurring units alone:

a) recurring units having pendant cyano groups attached directly to the hydrophobic backbone, and b) recurring units having pendant groups comprising poly(alkylene oxide) segments.

These polymeric binders comprise pendant poly(alkylene oxide) segments or side chains and preferably pendant poly(ethylene oxide) segments or side chains attached to the polymeric backbone. These polymers can be graft copolymers having a main chain polymer and poly(alkylene oxide) pendant side chains or segments or block copolymers having blocks of (alkylene oxide)-containing recurring units and non(alkylene oxide)-containing recurring units. Both graft and block copolymers can additionally have pendant cyano groups attached directly to the hydrophobic backbone. The alkylene oxide constitutional units are generally $C_1$ to $C_6$ alkylene oxide groups, and more typically $C_1$ to $C_3$ alkylene oxide groups. The alkylene portions can be linear or branched or substituted versions thereof. Poly(ethylene oxide) and poly(propylene oxide) segments are preferred and poly(ethylene oxide) segments are most preferred.

In some embodiments, the polymeric binders contain only recurring units comprising poly(alkylene oxide) segments, but in other embodiments, the polymeric binders comprise recurring units comprising the poly(alkylene oxide) segments as well as recurring units having pendant cyano groups attached directly to the hydrophobic backbone. By way of example only, such recurring units can comprise pendant groups comprising —CN, cyano-substituted or cyano-terminated alkylene groups. Recurring units can also be derived from ethylenically unsaturated polymerizable monomers such as acrylonitrile, methacrylonitrile, methyl cyanoacrylate, ethyl cyanoacrylate, or a combination thereof. However, cyano groups can be introduced into the polymer by other conventional means. Examples of such cyano-containing polymeric binders are described for example in U.S. patent application Publication 2005/003285 (Hayashi et al.) that is incorporated herein by reference.

By way of example, such polymeric binders can be formed by polymerization of a combination or mixture of suitable ethylenically unsaturated polymerizable monomers or macromers, such as:

A) acrylonitrile, methacrylonitrile, or a combination thereof,

B) poly(alkylene oxide) esters of acrylic acid or methacrylic acid, such as poly(ethylene glycol) methyl ether acrylate, poly(ethylene glycol) methyl ester methacrylate, or a combination thereof, and C) optionally, monomers such as acrylic acid, methacrylic acid, styrene, hydroxystyrene, acrylate esters, methacrylate esters, acrylamide, methacrylamide, or a combination of such monomers.

The amount of the poly(alkylene oxide) segments in such polymeric binders is generally from about 0.5 to about 60 weight %, preferably from about 2 to about 50 weight %, more preferably from about 5 to about 40 weight %, and most preferably from about 5 to 20 weight %. The amount of (alkylene oxide) segments in the block copolymers is generally from about 5 to about 60 weight %, preferably from about 10 to about 50 weight %, and more preferably from about 10 to about 30 weight %. It is also preferred that the polymeric binders having poly(alkylene oxide) side chains are present in the form of discrete particles.

The polymeric binders described above are generally present in an amount of from about 10 to about 70%, and preferably from about 20 to about 50%, based on the total solids content of the thermally-sensitive composition, or the dry weight of the layer prepared therefrom.

Optionally, the nanopaste may also include humectants, biocides, viscosity builders, colorants, pH adjusters, drying agents, defoamers or combinations thereof. Suitable humectants include ethylene glycol and sorbitol. Suitable biocides include Proxel GXL (supplied by Zeneca Corporation), Kathion X L (supplied by Rohm and Haas) and Triclosan (supplied by Ciba Specialty Chemicals). An example of a suitable viscosity builder includes polyethylene glycol.

The nanopaste useful in the present invention may form a thermally sensitive composition with the polymeric binder and any optional components described above. The thermally sensitive composition may include a radiation absorber. Radiation absorbers may absorb ultraviolet, visible, and/or infrared radiation and convert it to heat to affect the solubility of the thermally sensitive composition in a developer. The radiation absorber may comprise, for example, of a dye or pigment. In one embodiment, the radiation absorber may comprise from about 0.25 to about 25 w/w % of the thermally sensitive composition. In embodiments in which the radiation absorber is a dye, the dye may comprise from about 0.25 to about 15 w/w % of the thermally sensitive composition. In embodiments in which the radiation absorber is a pigment, the pigment may comprise from about 5 to about 25 w/w % of the thermally sensitive composition. Infrared radiation sensitive absorbers are particularly useful.

Suitable radiation absorbers may be soluble or dispersible in the carrier selected for use in the nanopaste. Examples of suitable dyes and pigments include carbon blacks and dyes or pigments of the squarylium, merocyanine, indolizine, pyrylium, or metal diothiolene class. Examples of radiation absorbing pigments are Projet 900, Projet 860 and Projet 830 (all available from the Zeneca Corporation), and carbon black. Dyes, especially dyes with a high extinction coefficient in the range of 750 nm to 1200 nm, are suitable. Radiation absorbing dyes are disclosed in numerous publications, for example, Nagasaka, EP 0 823 327; Van Damme, EP 0 908 397; DeBoer, U.S. Pat. No. 4,973,572; Jandrue, U.S. Pat. No. 5,244,771; and Chapman, U.S. Pat. No. 5,401,618. Examples of useful absorbing dyes include, ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectraIR 840A (Spectra Colors).

In one embodiment, the radiation absorber may be soluble in substantially aqueous carriers. Examples of such dyes include IR Dyes A, B, C, D and E, the structures of which are provided below:

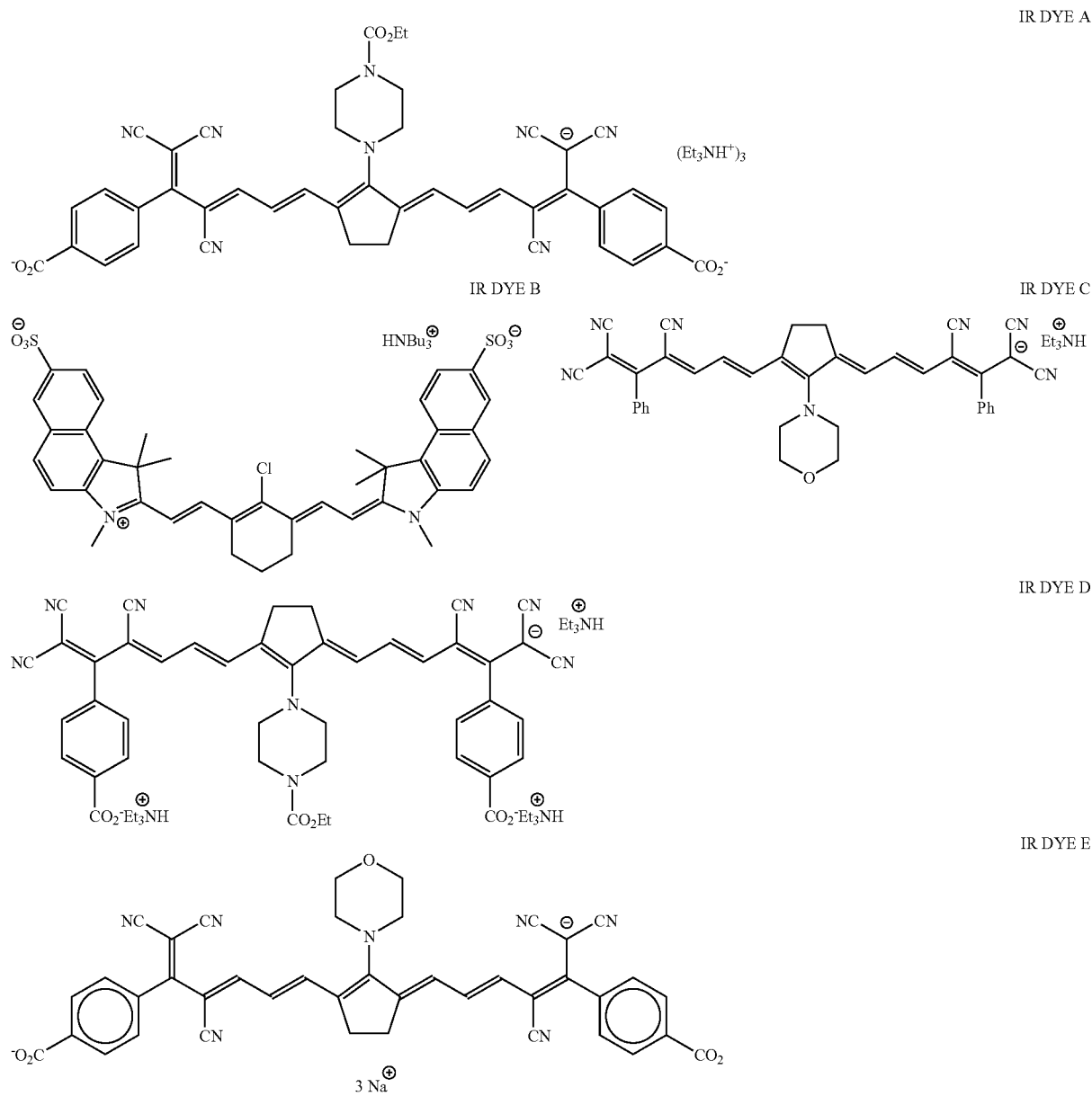

The thermally sensitive composition may be applied to the surface of a suitable substrate by conventional methods, such as by spin coating, bar coating, gravure coating or roller coating. In one embodiment, for example, the thermally sensitive composition may be applied with a wire wound bar onto the substrate surface. The thermally sensitive composition may then be air dried, oven dried or radiation cured to form a layer that adheres to the substrate. For example, the layer may be heated in an oven at between about 50° C. and about 200° C. for between about 30 seconds and about two minutes. In another example, the layer may be heated at about 80° C. for about 1 minute. The treatment step may remove and/or evaporate portions of the carrier and certain optional components, such as the dispersing agent, but leaving at least the nanoparticles and polymeric binder, if present.

The layer may then be imagewise exposed to thermal radiation, particularly to IR radiation, to affect the solubility of the exposed portions of the layer, such that exposed portions of the layer have a different solubility in a developer than unexposed portions. An example of a suitable radiation source is the Creo Trendsetter 3230, which contains a laser diode that emits near infrared radiation at a wavelength of about 830 nm and is available from Creo Products Inc. (Burnaby, BC, Canada), a subsidiary of Eastman Kodak Company. Another suitable radiation source is a Crescent 42T Platesetter, an internal drum platesetter that operates at a wavelength of 1064 nm (Gerber Scientific, South Windsor, Conn., USA). In some embodiments, both imaging and development can occur sequentially on-press, and printing can occur simultaneously with on-press development since development can occur within a few impressions.

Either the exposed or unexposed portions of the exposed layer is then developed on-press so that development to form an image does not require conventional development in an alkaline developer. The imaged element (that is, printing plate precursor) is directly mounted on press equipped with an ink and a fountain solution and operating the printing press to contact the exposed plate with the ink and fountain solution to remove either exposed portions or unexposed portions of the imaged layer. Simultaneously with development, the element is used to lithographically print on receiving sheets (for example paper sheets). Thus, in some embodiments, the exposed portions of the imaged layer are cured or hardened and remain on the plate while the unexposed portions in the imaged layer are removed by the fountain solution, lithographic ink, or a mixture of both, during the initial impressions in printing. In other embodiments, the exposed portions are removed while the unexposed portions remain on the plate.

Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+ Varn PAR (alcohol sub) (available from Varn International, Addison, Ill.). Suitable lithographic inks are well known. Suitable lithographic printing inks are also well known. On-press development is demonstrated in Examples 1–3 below.

The method of the present invention may be used in a variety of applications. Suitable applications include the use to provide lithographic printing plates. For example, an image can be formed in a positive working printing plate by applying the thermally sensitive composition to an ink receptive substrate, treating the composition to form a solid layer, imagewise exposing the layer to light, and then developing (and printing) on-press to form hydrophilic images areas and to reveal portions of the ink-receptive substrate. Alternatively, an image can be formed in a positive-working printing plate by applying the thermally sensitive, ink-receptive composition to an hydrophilic substrate, treating the composition to form a solid layer, imagewise exposing the layer to light, and then developing (and printing) on-press to form ink-receptive image areas and to reveal portions of the hydrophilic substrate.

In other embodiments, an image can be formed in a negative working printing plate by applying the thermally sensitive composition onto a hydrophilic substrate, treating the thermally sensitive composition to form a solid layer that adheres to the substrate, imaging to cure or harden the imaged portions, and developing on-press to remove unexposed portions.

The present invention is further illustrated by the following Examples but it is to be understood that the present invention is not limited to or by these examples.

EXAMPLES 1–3

Formation of Lithographic Printing Plates for On-Press Development

A brush-grained and phosphoric acid anodized aluminum sheet was coated using a wire wound bar with a layer of a thermally sensitive composition to a dry film weight of 1 g/m$^2$. This composition of the thermally sensitive layer is described in TABLE I below. The resulting film was then dried at 90° C. for about 30 seconds in a Ranar conveyor oven.

TABLE I

| | (Formulations in % solids) | | |
|---|---|---|---|
| Components | Example 1 | Example 2 | Example 3 |
| Ag solution | 3.35 | 3.16 | 2.97 |
| IR dye A | 0.37 | 0.37 | 0.37 |
| Klucel E | | 0.19 | |
| MMA solution | | | 0.37 |
| Water | 96.28 | 92.75 | 95.17 |

Ag sol was an inorganic nanopaste having a metallic particle mean diameter of 11.0 nm in a 5 w/w % solution in water, which is available from ANP (South Korea).

IR dye A is described above in the previous text.

Klucel E is a hydroxypropyl cellulose that was obtained from Hercules Inc. (Wilmington, Del.).

MMA solution was a poly(methyl methacrylate) dispersed in water.

The resulting printing plates of each of Examples 1–3 were image-wise exposed at 500 mJ/cm$^2$ on a Creo Trendsetter 3244x imagesetter. Following exposure, Example 1 showed no color change in the image areas. Example 2 showed a darkened image area. Example 3 showed a lightened image area.

The imaged plates were then mounted directly on an ABDick duplicator press charged with Van Son rubber-based black ink. The fountain solution was Varn 142W etch at 3 oz per gallon and PAR alcohol replacement at 3 oz per gallon. By sheet one, Examples 1 and 2 were printing a clean background. Example 3 printed a clean background by 100 sheets. The printing press was run for 200 impressions with each printing plate before the press was stopped.

The invention has been described in detail with particular reference to certain preferred embodiments thereof, but it will be understood that variations and modifications can be effected within the spirit and scope of the invention.

The invention claimed is:

1. A method for forming an image comprising:
   imagewise exposing a thermally sensitive composition formed from a nanopaste comprising inorganic nanoparticles and a carrier, which composition has been applied and treated as a layer to provide adhesion to a substrate, to affect the solubility of exposed portions of the applied and treated layer relative to unexposed portions of the applied layer; and
   developing the applied layer on-press with a fountain solution, lithographic ink, or both, to remove the exposed portions or unexposed portions of the layer to form an image.

2. The method of claim 1 wherein said inorganic nanoparticles are metal nanoparticles.

3. The method of claim 1 wherein the thermally sensitive composition further comprises a dispersing agent in the nanopaste, or a polymeric binder.

4. The method of claim 1 wherein the thermally sensitive composition comprises a polymeric binder comprising pendant poly(alkylene oxide) side chains.

5. The method of claim 1 for forming an image in a positive-working element wherein the exposed portions of the layer are removed during on-press development.

6. The method of claim 1 for forming an image in a negative-working element wherein exposed portions of the layer are cured or hardened and the unexposed portions of the layer are removed during on-press development.

7. The method of claim 1 comprising enhancing the ink-receptiveness of the image area.

8. The method of claim 1 wherein exposing the layer to radiation comprises exposing the layer to IR radiation.

9. A method for forming an image comprising:

applying onto a surface of a substrate, a thermally sensitive composition comprising a nanopaste that comprises inorganic nanoparticles and a carrier;

treating the thermally sensitive composition to form a solid layer that adheres to the surface of the substrate;

imagewise exposing the layer to radiation to affect the solubility of exposed portions of the layer relative to unexposed portions of the layer; and developing the layer on-press to remove the exposed portions or unexposed portions of the layer to form an image.

10. The method of claim 9 wherein the carrier is a substantially aqueous carrier.

11. The method of claim 10 wherein the substantially aqueous carrier consists essentially of a mixture of water and a water-miscible organic liquid.

12. The method of claim 11 wherein the water-miscible liquid consists essentially of an alcohol.

13. The method of claim 9 wherein the nanopaste comprises metal nanoparticles and a substantially aqueous solution.

14. The method of claim 9 wherein the nanopaste comprises from about 0.5 to about 75 w/w % inorganic nanoparticles.

15. The method of claim 9 wherein the nanopaste comprises from about 0.5 to about 25 w/w % inorganic nanoparticles.

16. The method of claim 9 wherein the treating step comprises drying the layer at from about 50 to about 300° C.

17. The method of claim 9 wherein the thermally sensitive composition comprises a polymeric binder comprising pendant poly(alkylene oxide) side chains.

18. A method for forming an image comprising:

applying onto a surface of a substrate, a thermally sensitive composition comprising a nanopaste that comprises inorganic nanoparticles, a polymeric binder comprising pendant poly(alkylene oxide) side chains, and a carrier;

treating the thermally sensitive composition to form a solid layer that adheres to the surface of the substrate;

imagewise exposing the layer on-press to infrared radiation to affect the solubility of exposed portions of the layer relative to unexposed portions of the layer; and developing the layer on-press to remove the exposed portions or unexposed portions of the layer to form an image.

19. The method of claim 18 for forming an image in a positive-working element wherein the exposed portions of the layer are removed during on-press development.

20. The method of claim 18 for forming an image in a negative-working element wherein exposed portions of the layer are cured or hardened and the unexposed portions of the layer are removed during on-press development.

* * * * *